(12) United States Patent
Kawashima et al.

(10) Patent No.: US 8,004,363 B2
(45) Date of Patent: Aug. 23, 2011

(54) WIDEBAND LOW-NOISE AMPLIFIER

(75) Inventors: Munenari Kawashima, Yokosuka (JP);
Yo Yamaguchi, Yokosuka (JP);
Kazuhiro Uehara, Yokosuka (JP);
Kenjiro Nishikawa, Yokusuka (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 19 days.

(21) Appl. No.: 12/595,163

(22) PCT Filed: May 16, 2008

(86) PCT No.: PCT/JP2008/059033
§ 371 (c)(1),
(2), (4) Date: Oct. 8, 2009

(87) PCT Pub. No.: WO2008/143174
PCT Pub. Date: Nov. 27, 2008

(65) Prior Publication Data
US 2010/0066452 A1 Mar. 18, 2010

(30) Foreign Application Priority Data
May 16, 2007 (JP) .................... 2007-131076

(51) Int. Cl.
*H03F 1/34* (2006.01)
(52) U.S. Cl. ....................... 330/293; 330/290
(58) Field of Classification Search .......... 330/290–294, 330/97, 296, 282
See application file for complete search history.

(56) References Cited

U.S. PATENT DOCUMENTS
4,370,624 A 1/1983 Ogawa et al.
5,661,437 A * 8/1997 Nishikawa et al. ........... 330/282
7,218,175 B1 * 5/2007 Kobayashi .................... 330/290

FOREIGN PATENT DOCUMENTS
JP 56-76611 A 6/1981
JP 59-171204 A 9/1984
(Continued)

OTHER PUBLICATIONS

Masayoshi Aikawa, Takashi Ohira, Tsuneo Tokumitsu, Tetsuo Hirota, and Masahiro Muraguchi, "Monolithic Microwave Integrated Circuit (MMIC)", pp. 97-99, published by Japanese Institute of Electronics, Information and Communication Engineers, issued Jan. 1997.
Herbert Knapp, Dietmar Zoschg, Thomas Meister, Klaus Aufinger, Sabine Boguth, and Ludwig Treitinger, "15 GHz Wideband Amplifier with 2.8 dB Noise Figure in SiGe Bipolar Technology", 2001 IEEE Radio Frequency Integrated Circuits Symposium, pp. 287-290 (2001).

*Primary Examiner* — Hieu P Nguyen
(74) *Attorney, Agent, or Firm* — Harness, Dickey & Pierce, P.L.C.

(57) ABSTRACT

A wideband low-noise amplifier of the present invention is designed such that an input terminal is connected to a base of a first transistor, one terminal of a first passive element, and one terminal of a third passive element; an emitter of the first transistor is grounded; a collector of the first transistor is connected to an output terminal, a base of a second transistor, one terminal of a capacitor, and one terminal of a second passive element; the other terminal of the first passive element is connected to the other terminal of the capacitor; an emitter of the second transistor is connected to the other terminal of the third passive element; and a power terminal is connected to a collector of the second transistor and the other terminal of the second passive element, wherein impedance of the third passive element is determined based on impedance of the first transistor whose emitter size is determined to suite desired saturation level of amplification, thus establishing input impedance matching.

16 Claims, 9 Drawing Sheets

FOREIGN PATENT DOCUMENTS

| | | |
|---|---|---|
| JP | 02-180412 A | 7/1990 |
| JP | 06-338741 A | 12/1994 |
| JP | 07-060975 B2 | 6/1995 |
| JP | 9-260958 A | 10/1997 |
| JP | 11-266132 A | 9/1999 |
| JP | 2002-171141 A | 6/2002 |
| JP | 2002-330030 A | 11/2002 |
| JP | 2003-516689 A | 5/2003 |
| JP | 2003-273676 A | 9/2003 |
| JP | 2004-159195 A | 6/2004 |
| SU | 543133 A1 | 1/1977 |
| WO | 01/43277 A1 | 6/2001 |
| WO | 02/09277 A2 | 1/2002 |
| WO | 2006/121650 A2 | 11/2006 |

\* cited by examiner

WIDEBAND LOW-NOISE AMPLIFIER

TECHNICAL FIELD

The present invention relates to wideband low-noise amplifiers having low noise figures, which are improved in linearity by increasing desired saturation levels of amplification without decreasing input impedances.

The present application claims priority based on Japanese Patent Application No. 2007-131076 filed in Japan on May 16, 2007, the content of which is incorporated herein by reference.

For example, a parallel negative feedback amplifier model, serving as a conventional amplifier having wideband characteristics, has a circuit constitution shown in FIG. 17. In FIG. 17, 161 designates an input terminal; 162 designates an output terminal; 163 designates a basic amplifier; and 164 designates a negative feedback circuit.

The negative feedback amplifier connects a negative feedback circuit of a feedback factor F owing small phase variations between the input terminal and the output terminal of a main amplifier of a voltage gain Av, thus decreasing the gain by 1/(1+FAv) while increasing a band by (1+FAv) (see Non-Patent Document 1, for example).

Increasing the supply voltage to transistors leads to improvement in the linearity of an amplifier, whereas there is a limit in further increasing the supply voltage due to voltage resistances of transistors.

For this reason, an improvement method of linearity by way of increasing emitter sizes of transistors is generally employed.

A low-noise amplifier, serving as a conventional wideband amplifier, has a circuit constitution shown in FIG. 18. In FIG. 18, 171 designates an input terminal; 172 designates an output terminal; 173 designates a power terminal; 174 and 175 designate transistors; 176, 177, 179, and 180 designate resistors; and 178 designates an inductor.

For the improvement of linearity, the low-noise amplifier uses transistors having large emitter sizes.

Using large transistors decreases input impedance to match 50Ω by way of the resistor 176 connected to the emitter of the transistor 174 (see Non-Patent Document 2, for example).

Non-Patent Document 1: "Monolithic Microwave Integrated Circuit (MMIC)" pp. 97-99, published by Japanese Institute of Electronics, Information and Communication Engineers, issued on January 1997, and jointly written by Masayoshi Aikawa, Takashi Ohira, Tsuneo Tokumitsu, Tetsuo Hirota, and Masahiro Muraguchi Non-Patent Document 2: Herbert Knapp, Dietmar Zoschg, Thomas Meister, Klaus Aufinger, Sabine Boguth, and Ludwig Treitinger "15 GHz Wideband Amplifier with 2.8 dB Noise Figure in SiGe Bipolar Technology", 2001 IEEE Radio Frequency Integrated Circuits Symposium, pp. 287-290 (2001)

DISCLOSURE OF INVENTION

Problem to be Solved by the Invention

The amplifier shown in FIG. 17 is designed to connect the negative feedback circuit in parallel to the main amplifier, thus causing a problem in which input impedance decreases.

Increasing emitter sizes of transistors in the amplifier also causes a similar problem in which input impedance decreases.

The low-noise amplifier shown in FIG. 18, in which the resistor is connected to the emitter of the main amplifier, suffers from a problem in which the noise figure degrades in response to the resistance of the resistor.

The present invention is created in light of the aforementioned circumstances, and the object thereof is to provide a wideband low-noise amplifier having a low noise figure, which is improved in linearity by increasing a desired saturation level of amplification without decreasing input impedance.

Means for Solving the Problem

A wideband low-noise amplifier of the present invention is designed such that an input terminal is connected to a base of a first transistor, one terminal of a first passive element, and one terminal of a third passive element; an emitter of the first transistor is grounded; a collector of the first transistor is connected to an output terminal, a base of a second transistor, one terminal of a capacitor, and one terminal of a second passive element; the other terminal of the first passive element is connected to the other terminal of the capacitor; an emitter of the second transistor is connected to the other terminal of the third passive element; and a power terminal is connected to a collector of the second transistor and the other terminal of the second passive element, wherein impedance of the third passive element is determined based on impedance of the first transistor whose emitter size is determined to suit a desired saturation level of amplification, thus establishing input impedance matching (for example, for the purpose of improving the saturation level of amplification, the impedance of the third passive element is increased to compensate for a reduction of the input impedance due to the increased emitter size of the first transistor, thus establishing the input impedance matching).

It is possible to rectify the wideband low-noise amplifier of the present invention such that the third passive element is constituted using any one of components such as a resistor, a variable resistor, and an inductor or using a series circuit composed of plural components.

According to this constitution in which the third passive element is constituted of a series circuit composed of a resistor and an inductor, it is possible to increase the impedance in a broad frequency range, thus achieving good input reflection characteristics and noise characteristics.

Constituting the third passive element using only a resistor may slightly degrade the noise characteristics in a high frequency range but achieves adequate characteristics in a low frequency range.

Constituting the third passive element using only an inductor may slightly degrade the reflection characteristics in a low frequency range but achieves adequate characteristics in a high frequency range.

It is possible to rectify the wideband low-noise amplifier of the present invention such that the first passive element is constituted using any one of components such as a resistor and a variable resistor or using a series circuit composed of plural components.

According to this constitution in which the first passive element is constituted of a resistor whose resistance is varied, it is possible to adjust the band and the gain.

When the first passive element is constituted of a variable resistor whose resistance is arbitrarily varied, it is possible to arbitrarily change the band and the gain.

It is possible to rectify the wideband low-noise amplifier of the present invention such that the second passive element is constituted using any one of components such as a resistor and an inductor or using a series circuit composed of plural components.

According to this constitution in which the second passive element is constituted of a series circuit including a resistor and an inductor, it is possible to establish the output impedance matching in a broad frequency range, thus achieving good output reflection characteristics.

Constituting the second passive element using a resistor may slightly degrade the impedance matching in a high frequency range but achieves adequate reflection characteristics in a low frequency range.

Constituting the second passive element using an inductor may slightly degrade the impedance matching in a low frequency range but achieves adequate reflection characteristics in a high frequency range.

A wideband low-noise amplifier of the present invention is designed such that an input terminal is connected to a base of a first transistor, one terminal of a first passive element, and one terminal of a fifth passive element; an emitter of the first transistor is grounded; a collector of the first transistor is connected to an output terminal, a base of a second transistor, one terminal of a capacitor, and one terminal of a second passive element; the other terminal of the first passive element is connected to the other terminal of the capacitor; an emitter of the second transistor is connected to one terminal of a fourth passive element; a power terminal is connected to a collector of the second transistor and the other terminal of the second passive element; the other terminal of the fourth passive element is connected to the other terminal of the fifth passive element and one terminal of a sixth passive element; and other terminal of the sixth passive element is grounded, wherein impedances of the fourth and sixth passive elements, impedance of the fifth passive element, or impedances of the fourth, fifth, and sixth passive elements are determined based on impedance of the first transistor whose emitter size is determined to suit a desired saturation level of amplification, thus establishing input impedance matching (for example, for the purpose of improving the saturation level of amplification, the impedances of the fourth and sixth passive elements are increased or the impedance of the fifth passive element is increased to compensate for a reduction of the input impedance due to the increased emitter size of the first transistor, thus establishing the input impedance matching.

It is possible to rectify the wideband low-noise amplifier of the present invention such that the fourth passive element is constituted using any one of components such as a resistor, a variable resistor and an inductor or using a series circuit composed of plural components.

According to this constitution in which the fourth passive element is constituted of a series circuit including a resistor and an inductor, it is possible to increase the impedance in a broad frequency range, thus achieving good input reflection characteristics and noise characteristics.

Constituting the fourth passive element using only a resistor may slightly degrade the noise characteristics in a high frequency range but achieves adequate characteristics in a low frequency range.

Constituting the fourth passive element using only an inductor may slightly degrade the reflection characteristics in a low frequency range but achieves adequate characteristics in a high frequency range.

It is possible to rectify the wideband low-noise amplifier of the present invention such that the fifth passive element is constituted using any one of components such as a resistor, a variable resistor and an inductor or using a series circuit composed of plural components.

According to this constitution in which the fifth passive element is constituted of a series circuit including a resistor and an inductor, it is possible to increase the impedance in a broad frequency range, thus achieving good input reflection characteristics and noise characteristics.

Constituting the fifth passive element using only a resistor may slightly degrade the noise characteristics in a high frequency range but achieves adequate characteristics in a low frequency range.

Constituting the fifth passive element using only an inductor may slightly degrade the reflection characteristics in a low frequency range but achieves adequate reflection characteristics in a high frequency range.

It is possible to rectify the wideband low-noise amplifier of the present invention such that the sixth passive element is constituted using any one of components such as a resistor, a variable resistor and an inductor or using a series circuit composed of plural components.

According to this constitution in which the sixth passive element is constituted of a series circuit including a resistor and an inductor, it is possible to increase the impedance in a broad frequency range, thus achieving good input reflection characteristics and noise characteristics.

Constituting the sixth passive element using only a resistor may slightly degrade the noise characteristics in a high frequency range but achieves adequate characteristics in a low frequency range.

Constituting the sixth passive element using only an inductor may slightly degrade the reflection characteristics in a low frequency range but achieves adequate characteristics in a high frequency range.

It is possible to rectify the wideband low-noise amplifier of the present invention such that the first passive element is constituted using any one of components such as a resistor and a variable resistor or using a series circuit composed of plural components.

According to this constitution in which the first passive element is constituted of a resistor whose resistance is varied, it is possible to adjust the band and the gain.

When the first passive element is constituted of a variable resistor whose resistance is arbitrarily varied, it is possible to arbitrarily vary the band and the gain.

It is possible to rectify the wideband low-noise amplifier of the present invention such that the second passive element is constituted using any one of components such as a resistor and an inductor or using a series circuit composed of plural components.

According to this constitution in which the second passive element is constituted of a series circuit including a resistor and an inductor, it is possible to establish the output impedance matching in a broad frequency range, thus achieving good output reflection characteristics.

Constituting the second passive element using only a resistor may slightly degrade the impedance matching in a high frequency range but achieves adequate reflection characteristics in a low frequency range.

Constituting the second passive element using only an inductor may degrade the impedance matching in a low frequency range but achieves adequate reflection characteristics in a high frequency range.

A wideband low-noise amplifier of the present invention is designed such that an input terminal is connected to a base of a first transistor, one terminal of a first passive element, and one terminal of a fifth passive element; an emitter of the first transistor is grounded; a collector of the first transistor is connected to an output terminal, a base of a second transistor, one terminal of a capacitor, and one terminal of a second passive element; the other terminal of the first passive element is connected to the other terminal of the capacitor; an emitter of the second transistor is connected to the other terminal of the fifth passive element and one terminal of a sixth passive element; a power terminal is connected to a collector of the second transistor and the other terminal of the second passive element; and the other terminal of the sixth passive element is grounded, wherein impedance of the fifth passive element and/or impedance of the sixth passive element is determined based on impedance of the first transistor whose emitter size is determined to suit a desired saturation level of amplification (for example, for the purpose of improving the saturation level of amplification, the impedances of the fifth and sixth passive elements are increased to compensate for a reduction of the input impedance due to the increased emitter size of the first transistor, thus establishing input impedance matching).

A wideband low-noise amplifier of the present invention includes a first transistor whose emitter is grounded, whose base is connected to an input terminal, and whose collector is connected to an output terminal; a negative feedback circuit, one terminal of which is connected to the collector of the first transistor and the other terminal of which is connected to the base of the first transistor; a second passive element, one terminal of which is connected to a power terminal and the other terminal of which is connected to the collector of the first transistor; and a bias circuit interposed between the power terminal and the base of the first transistor, wherein impedance of the bias circuit is determined based on impedance of the first transistor whose emitter size is determined to suit a desired saturation level of amplification, thus establishing input impedance matching (for example, for the purpose of improving the saturation level of amplification, the impedance of the bias circuit is increased to compensate for a reduction of the input impedance due to the increased emitter size of the first transistor, thus establishing the input impedance matching).

In the wideband low-noise amplifier of the present invention, the bias circuit is constituted of a second transistor whose base is connected to the output terminal and whose collector is connected to the power terminal, and a third passive element, one terminal of which is connected to the base of the first transistor and the other terminal of which is connected to an emitter of the second transistor (for example, for the purpose of improving the linearity of amplification, the impedance of the third passive element is increased to compensate for a reduction of the input impedance due to the increased emitter size of the first transistor, thus establishing input impedance matching).

In the wideband low-noise amplifier of the present invention, the third passive element is constituted of a fourth passive element whose one terminal is connected to an emitter of the second transistor, and a fifth passive element, one terminal of which is connected to the other terminal of the fourth passive element and the other terminal of which is connected to the base of the first transistor.

The wideband low-noise amplifier of the present invention further includes a sixth passive element, one terminal of which is connected to the other terminal of the fourth passive element and the other terminal of which is grounded.

In the wideband low-noise amplifier of the present invention, the negative feedback circuit is constituted of a capacitor whose one terminal is connected to the collector of the first transistor, and a first passive element, one terminal of which is connected to the base of the first transistor and the other terminal of which is connected to the other terminal of the capacitor.

In the wideband low-noise amplifier of the present invention, it is possible to use any one of a resistor, a variable resistor, and an inductor as the fourth passive element or the fifth passive element.

In the wideband low-noise amplifier of the present invention, it is possible to use any one of a resistor, a variable resistor, and an inductor as the sixth passive element.

Effect of the Invention

As described above, according to the present invention, the impedance of the third passive element interposed between the emitter of the second transistor and the base of the first transistor in the bias circuit including the second transistor for supplying a base current to the base of the first transistor is increased to suppress a reduction of the input impedance of the amplifier, wherein the impedance of the bias circuit is controlled to establish input matching (impedance matching) with respect to the base-emitter resistance of the first transistor.

According to the present invention, the first transistor having a large emitter size is implemented to increase the desired saturation level of amplification so as to improve the linearity of amplification, thus improving the noise figure since, unlike the conventional art, the emitter of the first transistor is not grounded via the passive element.

For the purpose of increasing the saturation level of amplification and for the purpose of improving the linearity of amplification, the present invention is designed to increase the emitter size of the first transistor compared to conventional transistors used in generally-known wideband low-noise amplifiers, wherein for the purpose of suppressing a reduction of the input impedance of the amplifier due to the reduced base-emitter resistance of the first transistor, the emitter size of the first transistor is defined based on the desired saturation level of amplification so that the impedance of the third passive element is increased based on the base-emitter resistance dependent of the emitter size, thus establishing the input impedance matching of the amplifier.

Therefore, the present invention is designed to increase the impedance of the third passive element so as to compensate for a reduction of the base-emitter resistance of the first transistor, thus suppressing a reduction of the input impedance.

Figure 1:
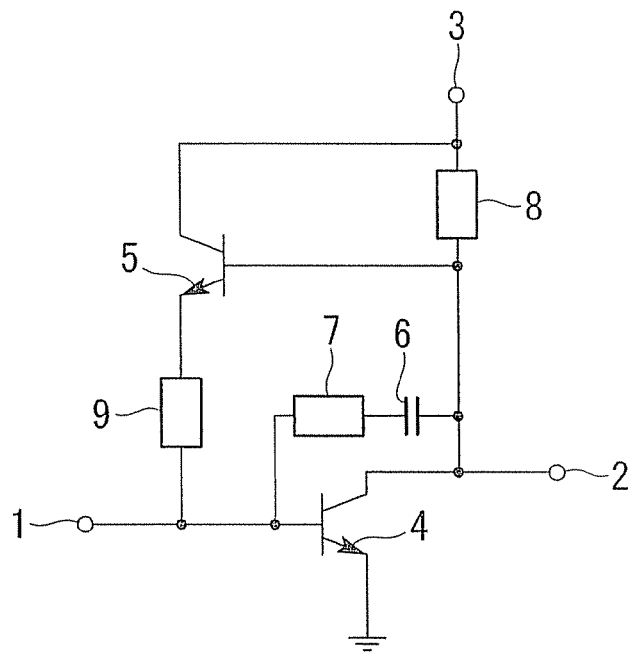
FIG. 1 A circuit diagram showing the constitution of a wideband low-noise amplifier according to a first embodiment of the present invention.

DESCRIPTION OF THE REFERENCE NUMERALS 1, 31, 51, 71, 81, 91, 111, 121, 141, 161, 171 . . . input terminal; 2, 32, 52, 92, 142, 162, 172 . . . output terminal; 3, 33, 53, 93, 143, 173 . . . power terminal; 4 . . . first transistor; 5 . . . second transistor; 6, 36, 56, 96, 146 . . . capacitor; 7 . . . first passive element; 8 . . . second passive element; 9 . . . third passive element; 19 . . . fourth passive element; 20 . . . fifth passive element; 21 . . . sixth passive element; 34, 35, 54, 55, 82, 94, 95, 122, 132, 144, 145, 174, 175 . . . transistor; 37, 39, 40, 57, 59, 60, 62, 83, 147, 149, 152 . . . resistor; 74, 114 . . . base-emitter resistor; 38, 41, 58, 61, 98, 100, 148, 151, 178 . . . inductor; 72, 73, 112, 113, 116, 117 . . . passive element; 97, 99, 123, 124, 133, 134, 137, 176, 177, 179, 180 . . . resistor; 75, 115 . . . mutual conductance; 84, 85, 125, 126, 135, 136 . . . voltage source; 163 . . . basis amplifier; 164 . . . negative feedback circuit.

BEST MODE FOR CARRYING OUT THE INVENTION

A wideband low-noise amplifier of the present invention demonstrating a high linearity is constituted of a first transistor whose emitter is grounded, whose base is connected to an input terminal, and whose collector is connected to an output terminal; a second transistor whose base is connected to the output terminal and whose collector is connected to a power terminal; a capacitor whose one terminal is connected to the base of the second transistor; a first passive element whose one terminal is connected to the base of the first transistor and whose other terminal is connected to the other terminal of the capacitor; a second passive element whose one terminal is connected to the base of the second transistor and whose other terminal is connected to the collector of the second transistor; and a third passive element whose one terminal is connected to the base of the first transistor and whose other terminal is connected to the emitter of the second transistor. In the amplifier, the impedance of the third passive element is determined such that the input impedance matches the impedance of the first transistor whose emitter size is determined to suit a desired saturation level of amplification.

In order to achieve the desired saturation level of amplification, the wideband low-noise amplifier of the present invention is designed to increase the emitter size of the first transistor compared to the conventional transistor.

For this reason, in the wideband low-noise amplifier of the present invention, after the base-emitter resistance is determined by setting the emitter size of the first transistor, the impedance of the third passive element is determined such that the input impedance matches the output impedance of an external circuit connected to the input terminal (for example, the impedance of the third passive element is determined so as to set the input impedance at 50Ω).

The capacitor used for the negative feedback mainly aims at cutting off a DC bias, wherein the capacitance thereof is set to low impedance at a clock frequency of the amplifier, thus preventing an influence on a frequency bandwidth. That is, the same effect is secured even when the capacitor is not connected between the first passive element and the collector of the first transistor but is connected between the first passive element and the base of the first transistor. In addition, the same effect can be secured even when the capacitor is connected between a plurality of elements constituting the first passive element.

In the present embodiment, for example, the emitter size of the first transistor is increased so as to decrease the base-emitter resistance, thus improving the improvement of the desired saturation level of amplification, while the negative feedback circuit is arranged so as to achieve a wideband property.

In the present embodiment, increasing the impedance (input impedance of the bias circuit) of the bias circuit (the circuitry composed of the third passive element) for supplying a base current to the first transistor compensates for a reduction of the base-emitter resistance of the first transistor and a reduction of the input impedance of the amplifier due to the negative feedback circuit, thus establishing input impedance matching, for example, such that the input impedance matches the output impedance of the external circuit supplying an input signal.

In the wideband amplifier of the present embodiment using transistors, increasing the impedance of the third passive element in the bias circuit for supplying a bias voltage to the base terminal of the first transistor compensates for a reduction of the input impedance, which is caused by arranging the negative feedback circuit including passive elements connected between bases and collectors and by increasing the emitter size of the first transistor for the purpose of the improvement of the saturation level of amplification, thus establishing the input impedance matching in the amplifier.

In the present embodiment, the bias circuit is interposed between the base of the first transistor and the power terminal and is constituted of the second transistor and the third passive element which are connected in series.

In the present embodiment, the negative feedback circuit is interposed between the collector and the base of the first transistor and is constituted of the first passive element and the capacitor which are connected in series.

First Embodiment

Next, a wideband low-noise amplifier according to a first embodiment of the present invention will be described with reference to the accompanying drawings.

FIG. 1 is a circuit diagram showing the constitution of the wideband low-noise amplifier of the present embodiment.

In FIG. 1, the wideband low-noise amplifier includes a first transistor 4, a second transistor 5, a capacitor 6, a first passive element 7, a second passive element 8, and a third passive element 9. The first transistor 4 and the second transistor 5 are NPN-type bipolar transistors.

As for the first transistor 4, the emitter is grounded, the base is connected to an input terminal 1, the collector is connected to an output terminal 2, and the collector is also connected to a power terminal 3 via the second passive element 8.

One terminal of the second passive element 8 is connected to the collector of the first transistor 4, and the other terminal is connected to the power terminal 3.

As for the second transistor 5, the base is connected to the output terminal 2, the collector is connected to the power terminal 3, and the emitter is connected to the base of the first transistor 4 via the third passive element 9.

One terminal of the passive element 9 is connected to the base of the first transistor 4, and the other terminal is connected to the emitter of the second transistor 5.

One terminal of the first passive element 7 serving as a negative feedback resistor is connected to the base of the first transistor 4, and the other terminal is connected to the other terminal of the capacitor 6.

In the present embodiment, for the purpose of the improvement of the desired saturation level of amplification and the linearity, the resistor, which is conventionally interposed between the emitter of the first transistor and the ground, is not interposed between the emitter of the first transistor and the ground so that the emitter of the first transistor is directly connected to the ground in order to suppress a reduction of the input impedance caused by increasing the emitter size of the first transistor.

The third passive element 9 increases the input impedance of the bias circuit in order to suppress a reduction of the input impedance of the amplifier, thus increasing the input impedance of the amplifier.

One terminal of the capacitor 6 is connected to the collector of the first transistor 4, and the other terminal is connected to the other terminal of the first passive element 7.

Next, the operation of the bias circuit composed of the second transistor 5 for supplying a current to the base of the first transistor 4 shown in FIG. 1 will be described with reference to FIGS. 2 to 4.

Figure 2:
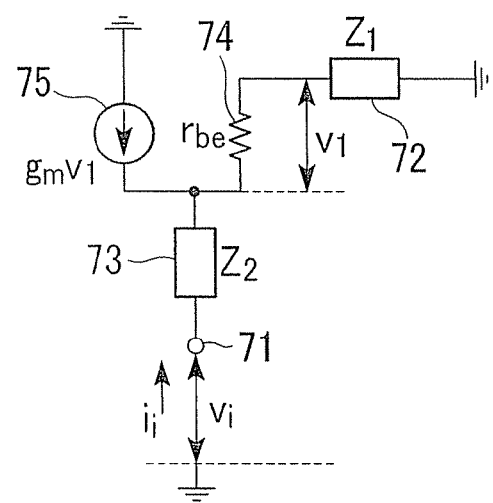
FIG. 2 A simplified equivalent circuit diagram of a bias circuit of the wideband low-noise amplifier according to the first embodiment of the present invention.

FIG. 2 showing the bias circuit constituting the wideband low-noise amplifier of the first embodiment is an equivalent circuit diagram simplifying the bias circuit composed of the second transistor 5, which is equivalently represented by a base-emitter resistance 74 of the second transistor 5 and a mutual conductance 75.

In FIG. 2, 71 designates an input terminal; 72 designates a passive element; and 73 designates a passive element. In FIG. 2, Z1 designates impedance of the passive element 72, and Z2 designates impedance of the passive element 73.

In FIG. 2, vi designates the voltage at the input terminal 71; ii designates the current at the input terminal 71; and v1 designates the base-emitter voltage of the second transistor 5.

Input impedance Zi of the bias circuit is given by Equation (1).

[Equation 1]

$$Z_i = \frac{v_i}{i_i} \qquad (1)$$

In Equation (1), the voltage vi is given by Equation (2), and the current ii is given by Equation (3).

[Equation 2]

$$v_1 = -(v_i - i_i Z_2)\left(\frac{r_{be}}{r_{be} + Z_1}\right) \qquad (2)$$

[Equation 3]

$$i_i = \frac{v_1 - i_i Z_2}{r_{be} + Z_1} - g_m v_1 \qquad (3)$$

Using Equations (2) and (3) leads to Equation (4).

[Equation 4]

$$i_i = \left(\frac{1 + r_{be}g_m}{r_{be} + Z_1}\right)[v_i - i_i Z_2] \qquad (4)$$

That is, the input impedance Zi of Equation (1) is given by Equation (5).

[Equation 5]

$$Z_i = \frac{v_i}{i_i} = \frac{r_{be} + Z_1 + Z_2(1 + r_{be}g_m)}{1 + r_{be}g_m} \qquad (5)$$

Equation (5) demonstrates that the input impedance of the bias circuit increases in response to increasing the input impedance Z2 of the passive element 73.

Figure 3:
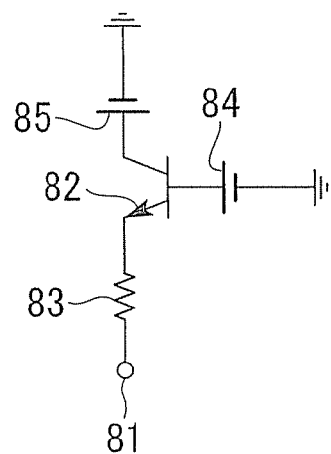
FIG. 3 A simplified circuit diagram illustrating the characteristics of the bias circuit of the wideband low-noise amplifier according to the first embodiment of the present invention.

FIG. 3 shows the bias circuit in which a simplified transistor composed of the base-emitter resistance 74 and the mutual conductance 75 in FIG. 2 is replaced with a transistor 82; the passive element 73 is replaced with a resistor 83; the passive element 72 is omitted; and voltage sources 84 and 85 are connected to supply power to the transistor 82.

In FIG. 3, the emitter size of the transistor 82 is 48 μm²; the voltage of the voltage source 84 is 0.9 V; the voltage of the voltage source 85 is 1.4 V; and the input impedance is 50Ω.

Figure 4:
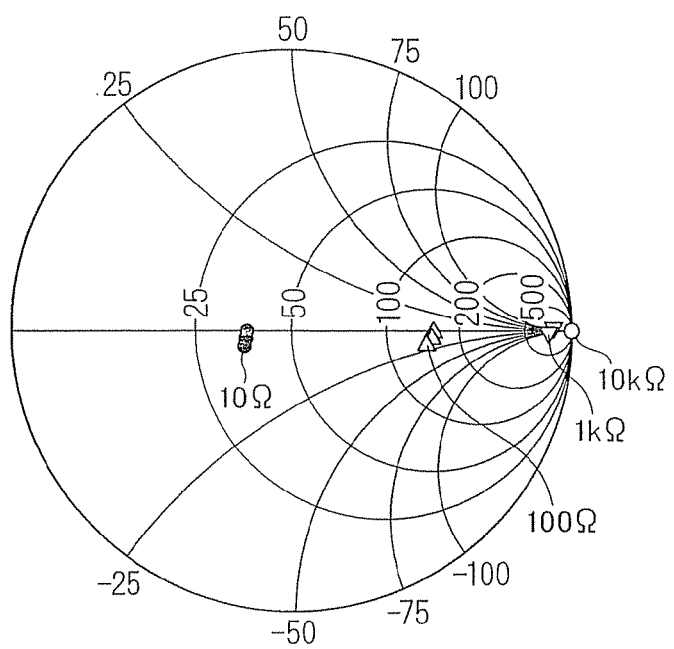
FIG. 4 A Smith chart illustrating the calculation result of an S parameter (S11) of the bias circuit of the wideband low-noise amplifier shown in FIG. 3.

FIG. 4 is a Smith chart showing the calculation result of an S parameter S11 which is varied by changing the value of the resistor 83 of the bias circuit of FIG. 3 with 10Ω, 100Ω, 1 kΩ, and 10 kΩ.

FIG. 4 shows that the input impedance of the bias circuit increases as the value of the resistor 83 increases.

Figure 5:
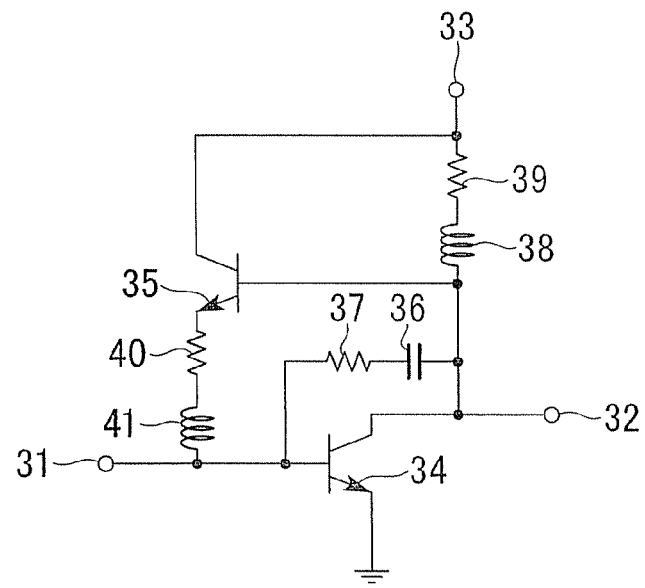
FIG. 5 A circuit diagram showing the specific circuitry of the wideband low-noise amplifier according to the first embodiment of the present invention.

FIG. 5 is a circuit diagram showing the specific circuitry of the wideband low-noise amplifier according to the first embodiment of the present invention. In FIG. 5, 31 designates an input terminal; 32 designates an output terminal; 33 designates a power terminal; 34 designates a first transistor; 35 designates a second transistor; 36 designates a capacitor; 37, 39, and 40 designate resistors; and 38 and 41 designate inductors.

The series connection composed of the resistor 40 and the inductor 41 corresponds to the third passive element 9; the series connection composed of the resistor 39 and the inductor 38 corresponds to the second passive element 8; and the resistor 37 corresponds to the first passive element 7.

Figure 6:
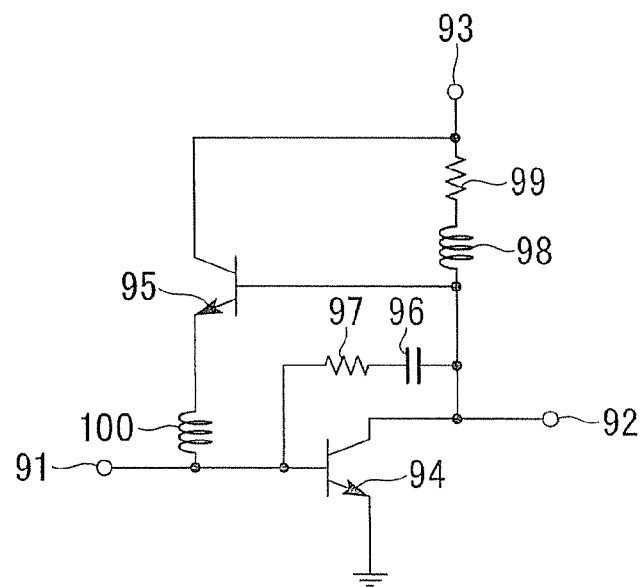
FIG. 6 A circuit diagram showing another specific circuitry of the wideband low-noise amplifier according to the first embodiment of the present invention for the purpose of comparison.

Similar to FIG. 5, FIG. 6 is a circuit diagram showing the specific circuitry of the wideband low-noise amplifier according to the first embodiment of the present invention, which is drawn for the purpose of comparison so as to indicate a specific effect of the wideband low-noise amplifier according to the first embodiment of the present invention shown in FIG. 3. In FIG. 6, 91 designates an input terminal; 92 designates an output terminal; 93 designates a power terminal; 94 designates a first transistor; 95 designates a second transistor; 96 designates a capacitor; 97 and 99 designates resistors; and 98 and 100 designate inductors. The series connection composed of the resistor 96 and the inductor 98 corresponds to the second passive element 8; the resistor 97 corresponds to the first passive element 7; and the inductor 100 corresponds to the third passive element 9.

Figure 7:
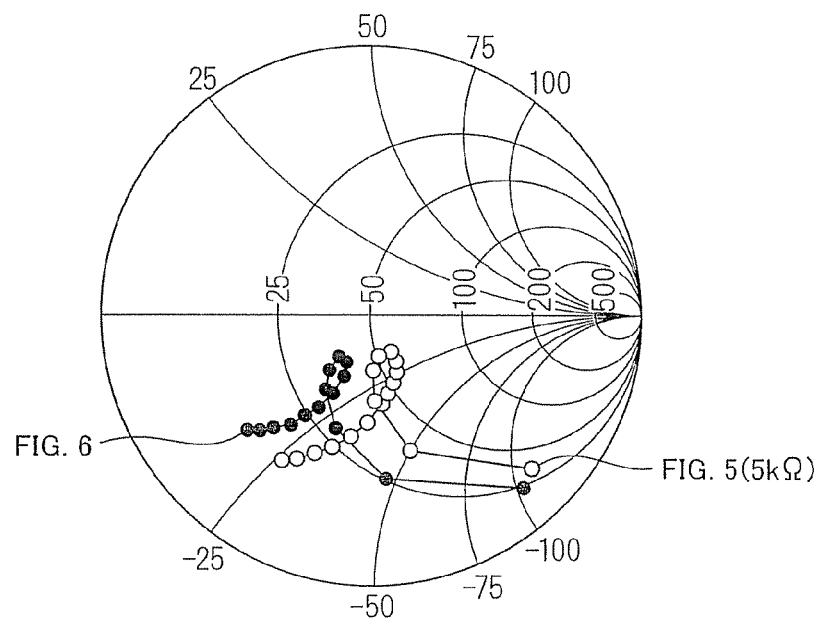
FIG. 7 A Smith chart illustrating the calculation result of S parameters (S11) of the wideband low-noise amplifiers of the first embodiment shown in FIGS. 5 and 6.

FIG. 7 is a Smith chart showing the simulation result of S parameters (S11) in the specific circuitry of the wideband low-noise amplifier according to the first embodiment of the present invention shown in FIG. 5 and in the specific circuitry of the wideband low-noise amplifier shown in FIG. 6.

In FIG. 7, white circles indicate S parameters (S11) in the specific circuitry of the wideband low-noise amplifier according to the first embodiment of the present invention shown in FIG. 5, and black circles indicate S parameters (S11) in the specific circuitry of the wideband low-noise amplifier according to the first embodiment of the present invention shown in FIG. 6.

In FIG. 5, the emitter size of the transistor 34 is 80 μm²; the emitter size of the transistor 35 is 16 μm²; the capacitance of the capacitor 36 is 3 pF; the resistance of the resistor 37 is 500Ω; the inductance of the inductor 38 is 0.5 nH; the resistance of the resistor 39 is 100Ω; the resistance of the resistor 40 is 5,000Ω; the inductance of the inductor 41 is 0.5 nH; and the input/output impedance is 50Ω. FIG. 7 shows that the circuit constitution of the present invention establishes impedance matching since the input impedance matching condition approaches 50Ω. The same values for the components in FIG. 5 are applied to the corresponding components in FIG. 6.

Constituting the third passive element 9 with a series circuit composed of the resistor 40 and the inductor 41 increases the input impedance of the amplifier within a clock frequency range, thus achieving good input reflection characteristics and noise characteristics.

Constituting the third passive element 9 using only the resistor 40 without using the inductor 41 may degrade noise characteristics in a high frequency range but achieves adequate characteristics in a low frequency range.

Constituting the third passive element 9 using only the inductor 41 without using the resistor 40 may degrade reflection characteristics in a low frequency range but achieves adequate characteristics in a high frequency range.

By arbitrarily varying the resistance of a variable resistor serving as the resistor 40, it is possible to arbitrarily change the frequency range and gain.

As the third passive element 9, it is possible to use any one of a resistor, a variable resistor, and an inductor, alternatively, it is possible to use a series connection composed of any combinations of these components.

As shown in FIG. 5, the first passive element 7 is composed of the resistor 37, the resistance of which is varied so as to adjust the frequency range and gain.

Alternatively, the resistor 37 serving as the first passive element 7 is composed of a variable resistor, the resistance of which is arbitrarily varied so as to arbitrarily change the frequency range and gain.

It is possible to constitute the first passive element 7 by using either a resistor or a variable resistor or by using both of them connected in series.

As shown in FIG. 5, the second passive element 8 is constituted of a series circuit composed of the resistor 39 and the inductor 38 so as to establish the output impedance matching in a broad frequency range, thus achieving good output reflection characteristics.

Constituting the second passive element 8 by using only the resistor 39 without using the inductor 38 may slightly degrade the impedance matching of the amplifier in a high frequency range but achieves adequate reflection characteristics in a low frequency range.

Constituting the second passive element 8 by using only the inductor 38 without using the resistor 39 may slightly degrade the impedance matching of the amplifier in a low frequency range but achieves adequate reflection characteristics in a high frequency range.

As the second passive element 8, it is possible to use any one of a resistor, a variable resistor, and an inductor, alternatively, it is possible to use a series connection composed of any combinations of these components.

Second Embodiment

Next, a wideband low-noise amplifier according to a second embodiment of the present invention will be described with reference to the accompanying drawings.

Figure 8:
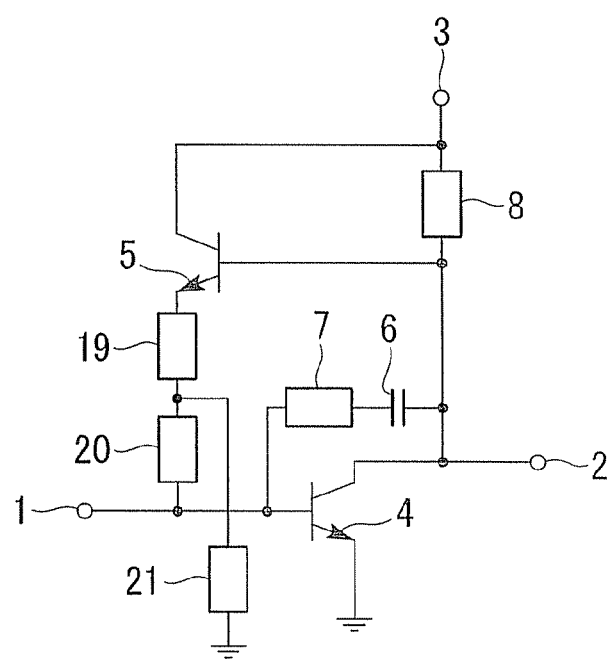
FIG. 8 A circuit diagram showing the constitution of a wideband low-noise amplifier according to a second embodiment of the present invention.

FIG. 8 is a circuit diagram showing the constitution of the wideband low-noise amplifier of the present embodiment.

In FIG. 8, the wideband low-noise amplifier includes the first transistor 4, the second transistor 5, the capacitor 6, the first passive element 7, the second passive element 8, and the third passive element 9. The third passive element 9 includes a fourth passive element 19, a fifth passive element 20, and a sixth passive element 21. The first transistor 4 and the second transistor 5 are NPN-type bipolar transistors.

The connection relationship between the first transistor 4, the second transistor 5, the capacitor 6, the first passive element 7, and the second passive element 8 in the second embodiment is identical to that in the first embodiment shown in FIG. 1; hence, the description thereof will be omitted.

In the third passive element 9 of the second embodiment, the fourth passive element 1 and the fifth passive element 20 are interposed in series between the emitter of the second transistor 5 and the base of the first transistor 4, and the sixth passive element 21 is interposed between the ground and a connection point between the fourth passive element 19 and the fifth passive element 20.

Next, the operation of the bias circuit composed of the second transistor 5 for supplying a current to the base of the first transistor 4 shown in FIG. 8 will be described with reference to FIGS. 9 to 11.

Figure 9:
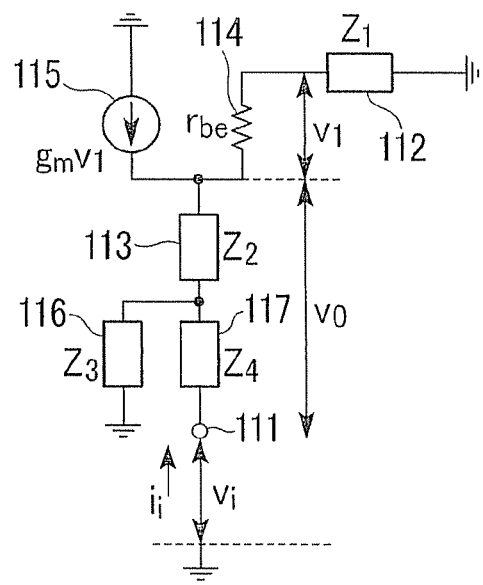
FIG. 9 A simplified equivalent circuit diagram of the bias circuit of the wideband low-noise amplifier according to the second embodiment of the present invention.

FIG. 9 showing the bias circuit of the wideband low-noise amplifier according to the second embodiment of the present invention is an equivalent circuit diagram simplifying the bias circuit composed of the second transistor 5, which is equivalently represented by a base-emitter resistance 114 of the second transistor 5 and a mutual conductance 115.

In FIG. 9, 111 designates an input terminal; 112 designates a passive element; 113 designates a passive element; 117 designates a passive element; and 116 designates a passive element.

In FIG. 9, Z1 designates the impedance of the passive element 112; Z2 designates the impedance of the passive element 113; Z3 designates the impedance of the passive element 116; and Z4 designates the impedance of the passive element 117.

In FIG. 9, vi designates the voltage at the input terminal 111; ii designates the current at the input terminal 111; and v1 designates the base-emitter voltage of the second transistor 5.

Input impedance Zi of the bias circuit is given by Equation (6).

[Equation 6]

$$Z_i = \frac{v_i}{i_i} \qquad (6)$$

In Equation (6), the voltage vi and the current ii are represented by Equations (7) and (8) respectively.

[Equation 7]

$$v_i = -\left[v_i\left(1 + \frac{Z_2}{Z_3}\right) - i_i\left(Z_2 + Z_4 + \frac{Z_2 Z_4}{Z_3}\right)\right]\left(\frac{r_{be}}{r_{be} + Z_1}\right) \qquad (7)$$

[Equation 8]

$$i_i = \frac{v_i\left(1 + \frac{Z_2}{Z_3}\right) - i_i\left(Z_2 + Z_4 + \frac{Z_2 Z_4}{Z_3}\right)}{r_{be} + Z_1} - g_m v_1 \qquad (8)$$

Putting Equation (7) into Equation (8) leads to Equation (9).

[Equation 9]

$$i_i = \left(\frac{1 + r_{be} g_m}{r_{be} + Z_1}\right)\left[v_i\left(1 + \frac{Z_2}{Z_3}\right) - i_i\left(Z_2 + Z_4 + \frac{Z_2 Z_4}{Z_3}\right)\right] \qquad (9)$$

Substituting Equation (10) for the impedance Z3 of the passive element 116 in Equation (9) leads to Equation (11).

[Equation 10]

$$Z_3 = \frac{1}{k} Z_2 \qquad (10)$$

[Equation 11]

$$Z_i = \frac{v}{i_i} = \frac{r_{be} + Z_1 + [Z_2 + (1 + k)Z_4](1 + r_{be} g_m)}{(1 + r_{be} g_m)(1 + k)} \qquad (11)$$

Therefore, Equation (11) indicates that the input impedance of the bias circuit increases in response to increasing of the impedances Z2 and Z4 of the passive elements 113 and 117.

Figure 10:
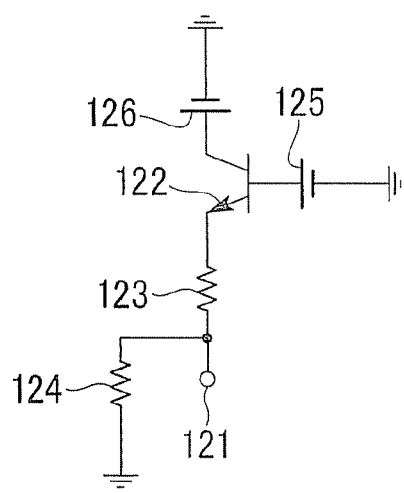
FIG. 10 A simplified circuit diagram illustrating the characteristics of the bias circuit of the wideband low-noise amplifier according to the second embodiment of the present invention.

FIG. 10 shows a bias circuit, in which compared to FIG. 10, the base-emitter resistance 114 and the mutual conductance 115 are replaced with a transistor 122; the passive element 113 is replaced with a resistor 123; the passive element 116 is replaced with a resistor 124; the passive element 117 is omitted; and voltage sources 125 and 126 are connected to supply voltages to the transistor 122.

In FIG. 10, the emitter size of the transistor 122 is 48 μm²; the voltage of the voltage source 125 is 0.9 V; the voltage of the voltage source 126 is 1.4 V; and the input impedance is 50Ω.

Figure 11:
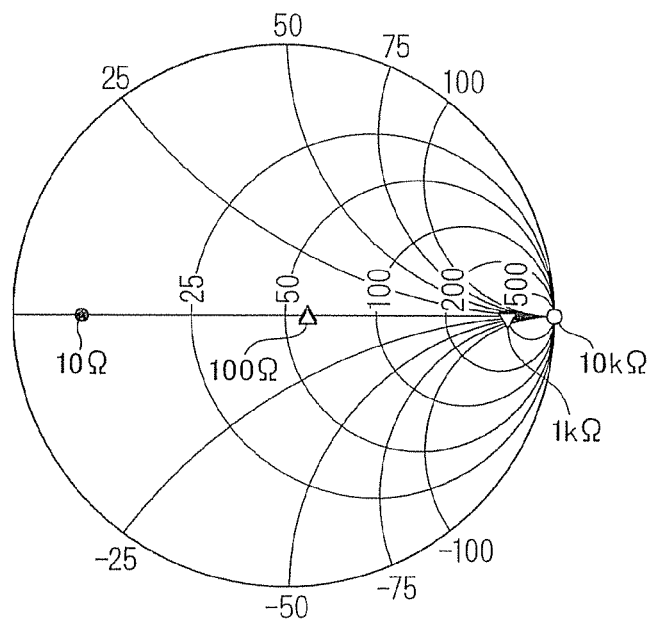
FIG. 11 A Smith chart illustrating the calculation result of an S parameter (S11) of the bias circuit of the wideband low-noise amplifier shown in FIG. 10.

FIG. 11 shows the calculation result of the parameter S11 which is calculated by changing each of the values of the resistors 123 and 124 of the bias circuit of FIG. 10 to 10Ω, 100Ω, 1 kΩ, and 10 kΩ.

FIG. 11 shows that the input impedance increases as the resistances of the resistors 123 and 124 increase.

Figure 12:
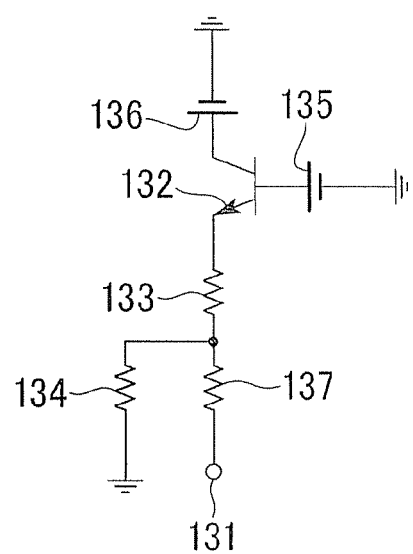
FIG. 12 A simplified circuit diagram illustrating the characteristics of the bias circuit of the wideband low-noise amplifier according to the second embodiment of the present invention.

FIG. 12 shows a bias circuit, in which compared to FIG. 9, the base-emitter resistance 114 and the mutual conductance 115 are replaced with a transistor 132; the passive element 113 is replaced with a resistor 133; the passive element 116 is replaced with a resistor 134; the passive element 117 is replaced with a resistor 137; the passive element 112 is omitted; and voltage sources 135 and 136 are connected to supply voltages to the transistor 132.

In FIG. 12, the emitter size of the transistor 132 is 48 μm²; the voltage of the voltage source 135 is 0.9 V; the voltage of the voltage source 136 is 1.4 V; the resistances of the resistors 133 and 134 are each set to 50Ω; and the input impedance is 50Ω.

Figure 13:
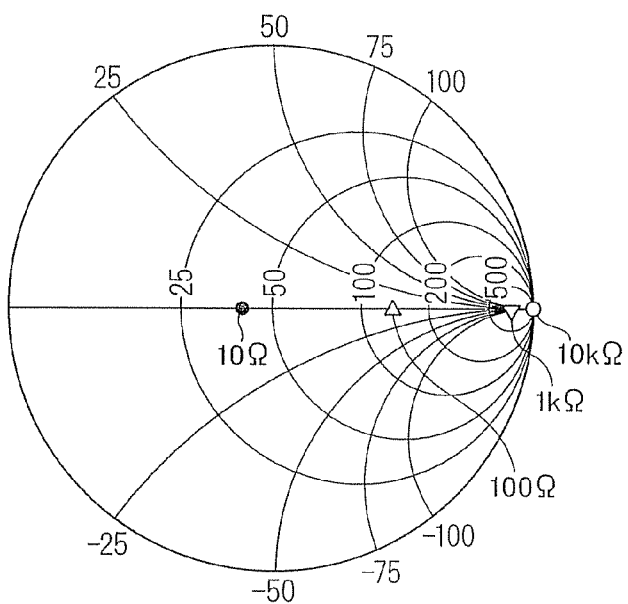
FIG. 13 A Smith chart illustrating the calculation result of an S parameter (S11) of the bias circuit of the wideband low-noise amplifier shown in FIG. 12.

FIG. 13 shows the calculation result of the S parameter 511 which is calculated by changing the value of the resistor 137 of the bias circuit of FIG. 12 to 10Ω, 100Ω, 1 kΩ, and 10 kΩ.

FIG. 13 shows that the input impedance increases as the resistance of the resistor 137 increases.

Figure 14:
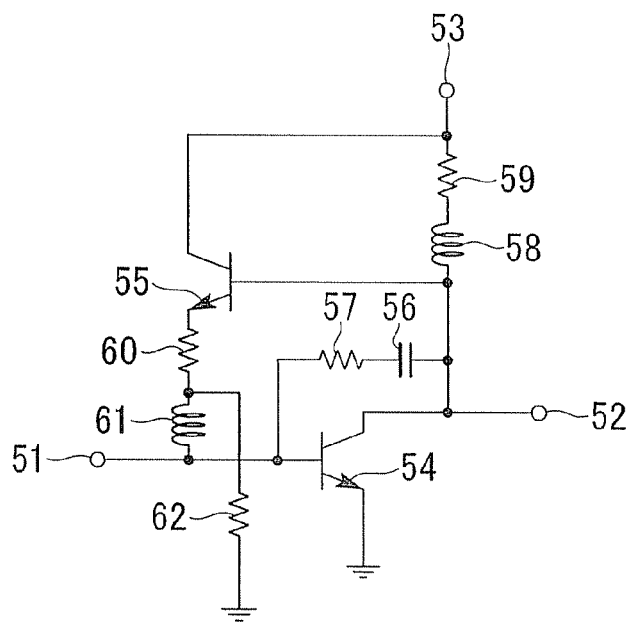
FIG. 14 A circuit diagram showing the specific circuitry of the wideband low-noise amplifier according to the second embodiment of the present invention.

FIG. 14 is a circuit diagram showing the specific circuitry of a wideband low-noise amplifier according to the second embodiment of the present invention. In FIG. 14, 51 designates an input terminal; 52 designates an output terminal; 53 designates a power terminal; 54 designates a first transistor; 55 designates a second transistor; 56 designates a capacitor; 57, 59, 60, and 62 designate resistors; the 58 and 61 designate inductors.

In the above, the resistor 40 corresponds to the fourth passive element 19; the inductor 61 corresponds to the fifth passive element 20; the resistor 62 corresponds to the sixth passive element 21; a series connection composed of the resistor 59 and the inductor 58 corresponds to the second passive element 8; and the resistor 57 corresponds to the first passive element 7.

Figure 15:
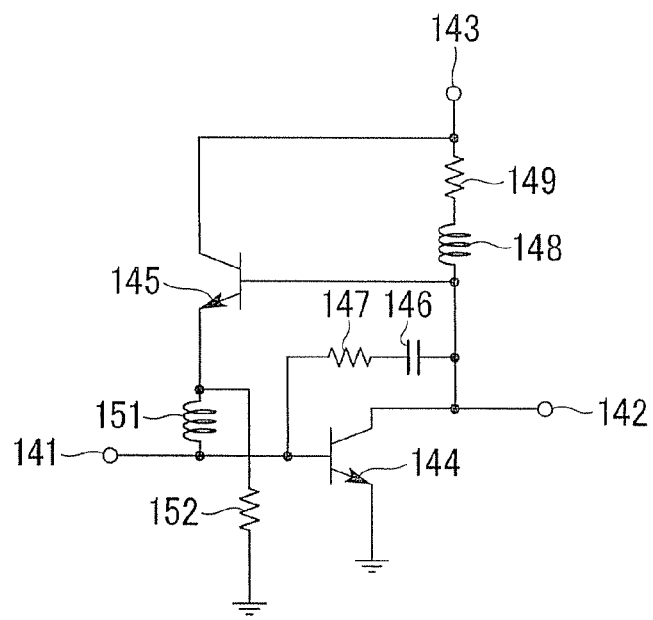
FIG. 15 A circuit diagram showing another specific circuitry of the wideband low-noise amplifier according to the second embodiment of the present invention for the purpose of comparison.

Similar to FIG. 14, FIG. 15 is a circuit diagram showing the specific circuitry of a wideband low-noise amplifier according to the second embodiment, which is illustrated for the purpose of demonstrating the effect of the specific circuitry of the wideband low-noise amplifier according to the second embodiment of the present invention shown in FIG. 8. In FIG. 15, 141 designates an input terminal; 142 designates an output terminal; 143 designates a power terminal; 144 designates a first transistor; 145 designates a second transistor; 146 designates a capacitor; 147, 149, and 152 designate resistors; 148 and 151 designate inductors. A series connection composed of the resistor 149 and the inductor 148 corresponds to the second passive element 8; the resistor 147 corresponds to the first passive element 7; the inductor 151 corresponds to the fifth passive element 20; and the resistor 152 corresponds to the sixth passive element 21.

Figure 16:
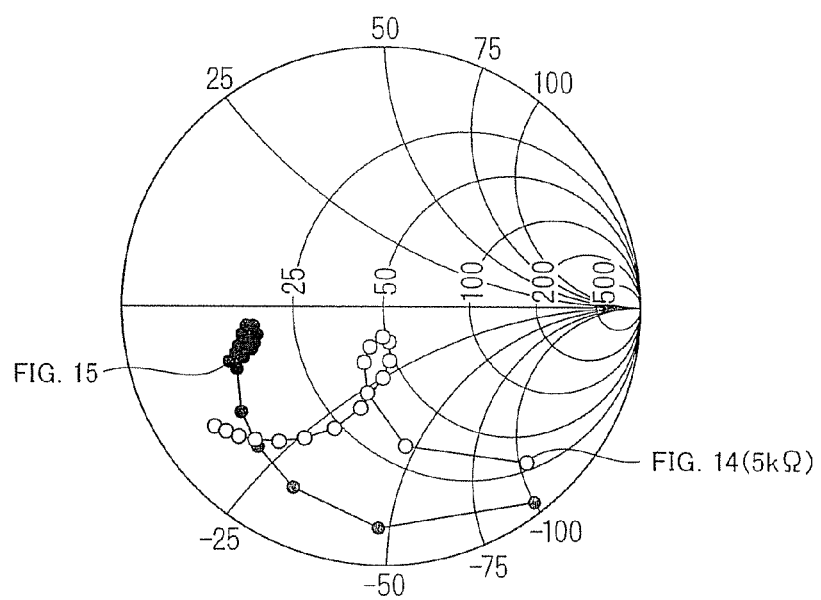
FIG. 16 A Smith chart illustrating the calculation result of S parameters (S11) of the wideband low-noise amplifiers of the second embodiment shown in FIGS. 14 and 15.
Figure 17:
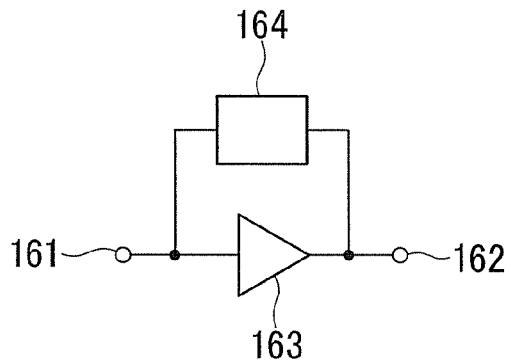
FIG. 17 A diagram showing a conventional model of a negative feedback amplifier disclosed in Non-Patent Document 1.

FIG. 16 is a Smith chart showing the simulation result of the S parameter (S11) with respect to the specific circuitry of the wideband low-noise amplifier according to the second embodiment of the present invention shown in FIG. 14 and the specific circuitry of the wideband low-noise amplifier shown in FIG. 15.

In FIG. 16, white circles indicate S parameters (S11) with respect to the specific circuitry of the wideband low-noise amplifier according to the second embodiment of the present invention shown in FIG. 14, while black circles indicate S parameters (S11) with respect to the specific circuitry of the wideband low-noise amplifier according to the second embodiment of the present invention shown in FIG. 15.

In FIG. 14, the emitter size of the transistor 54 is 80 $\mu m^2$; the emitter size of the transistor 55 is 16 $\mu m^2$; the capacitance of the capacitor 56 is 3 pF; the resistance of the resistor 57 is 500Ω; the inductance of the inductor 58 is 0.5 nH; the resistance of the resistor 59 is 100Ω; the resistance of the resistor 60 is 5,000Ω; the inductance of the inductor 61 is 0.5 nH; the resistance of the resistor 62 is 5,000Ω; and the input/output impedance is 50Ω. FIG. 16 proves that the circuitry of the present invention establishes the impedance matching since the input impedance matching condition approaches 50Ω.

As described above in conjunction with FIG. 14, the third passive element 9 is constituted of a series circuit composed of the resistor 60 and the inductor 61, which is interposed between the emitter of the transistor 55 and the base of the transistor 54, and the resistor 62, which is interposed between the ground and the connection point between the resistor 60 and the inductor 61; thus, it is possible to increase the input impedance of the amplifier in a broad frequency range, thus achieving good input reflection characteristics and noise characteristics.

When the third passive element 9 is constituted using only the resistors 60 and 62 without using the inductor 61, the noise characteristics may degrade in a high frequency range, but it is possible to achieve adequate characteristics in a low frequency range.

When the third passive element 9 is constituted using only the inductor 61 and the resistor 62 without using the resistor 60, the reflection characteristics may degrade in a low frequency range, but it is possible to achieve adequate characteristics in a high frequency range.

As shown in FIG. 14, the first passive element 1 is composed of the resistor 57 whose resistance is varied so as to adjust the band and the gain.

Alternatively, the first passive element 7 is composed of a variable resistor serving as the resistor 57 whose resistance is arbitrarily varied to arbitrarily change the band and the gain.

It is possible to constitute the first passive element 7 using either a resistor or a variable resistor, or using a series connection of them.

When the second passive element 8 is constituted using a series circuit composed of the resistor 59 and the inductor 58 as shown in FIG. 14, it is possible to establish the output impedance matching of the amplifier in a broad frequency range, thus achieving good output reflection characteristics.

When the second passive element 8 is constituted using only the resistor 59 without using the inductor 58, the impedance matching may degrade in a high frequency range, but it is possible to achieve adequate reflection characteristics in a low frequency range.

When the second passive element 8 is constituted using only the inductor 58 without using the resistor 59, the impedance matching of the amplifier may degrade in a low frequency range, but it is possible to achieve adequate reflection characteristics in a high frequency range.

As described above, it is possible to constitute the second passive element 8 using either a resistor or an inductor, or using a series connection of them.

It is possible to constitute the fifth passive element 20 of FIG. 8 using any one of a resistor, a variable resistor, and an inductor, or using a series circuit composed of any components.

It is possible to constitute the sixth passive element 21 of FIG. 8 using any one of a resistor, a variable resistor, and an inductor, or using a series connection of any components.

The above embodiments show the present invention in an illustrative manner but in a restrictive manner; hence, the present invention can be implemented in various variations and modifications.

Therefore, the scope of the present invention is stipulated by the claims and their equivalent ranges.

The present invention achieves high-linearity wideband low-noise amplifiers, which are applicable to a broad range of fields involved in software radio communications, cognitive radio communications and measuring instruments, and requiring high linearity, wideband characteristics and low-noise characteristics.

Figure 18:
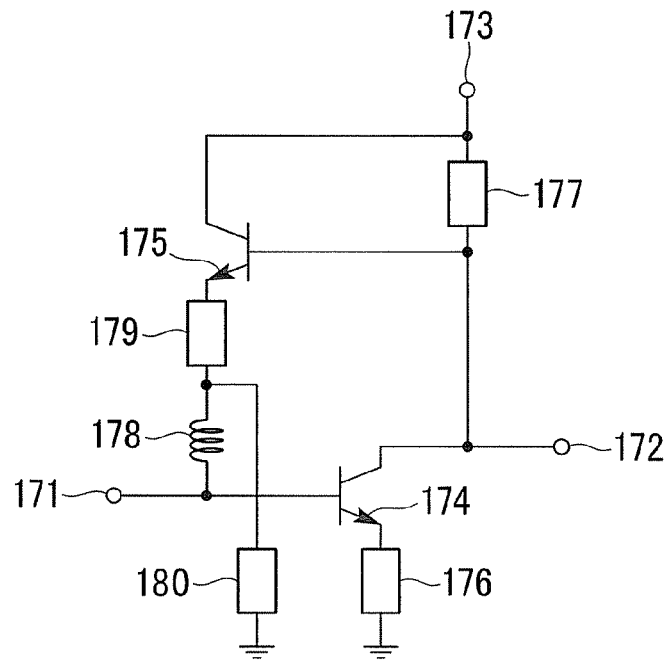
FIG. 18 A circuit diagram showing the wideband low-noise amplifier disclosed in Non-Patent Document 2.

The foregoing conventional technology of FIG. 18 implements a series feedback constitution connecting the resistor 176 to the emitter of the transistor 174, thus achieving wideband characteristics and high input impedance.

For the purpose of the improvement of the noise figure compared to the conventional technology, the present invention illustrated in FIG. 1 (first embodiment) and in FIGS. 8 and 15 (second embodiment) excludes a series feedback resistor connected to the emitter used in the conventional technology shown in FIG. 18 but implements a negative feedback constitution composed of passive elements.

The noise figure of the conventional technology of FIG. 18 decreases by a factor of 4k·T·Rs (where k denotes Boltzmann constant; T denotes an absolute temperature; and Rs denotes the resistance of the series feedback resistor) due to the series feedback resistor connected to the emitter.

In contrast, the noise figure of the present embodiment decreases by a factor of 4k·T/Rp (where Rp denotes the resistance of the negative feedback resistor) due to the negative feedback resistor connected between the emitter and the collector and used in the negative feedback circuit. Therefore, the noise figure is improved because of 4k·T·Rs>4k·T/Rp as long as Rs and Rp demonstrate the same band and gain. This point is an inherent difference between the present invention and the conventional technology.

In this connection, the capacitor 6 mainly aims at cutting off a DC bias current, wherein it does not affect the frequency bandwidth since the capacitance thereof is set to low impedance at the clock frequency of the amplifier. Therefore, the same effect can be secured irrespective of the inserting position of the capacitor in the negative feedback circuit.

The invention claimed is:

1. A wideband low-noise amplifier wherein an input terminal is connected to a base of a first transistor, one terminal of a first passive element, and one terminal of a third passive element, wherein an emitter of the first transistor is connected directly to ground, a collector of the first transistor is connected to an output terminal, a base of a second transistor, one terminal of a capacitor, and one terminal of a second passive element, wherein an other terminal of the first passive element is connected to an other terminal of the capacitor, an emitter of the second transistor is connected to an other terminal of the third passive element, and a power terminal is connected to a collector of the second transistor and an other terminal of the second passive element, and wherein an impedance of the third passive element is determined based on an impedance of the first transistor whose emitter size is determined to suit a desired saturation level of amplification, thus establishing input impedance matching.

2. The wideband low-noise amplifier according to claim 1, wherein the third passive element is constituted using any one of components such as a resistor, a variable resistor, and an inductor or using a series circuit composed of plural components.

3. The wideband low-noise amplifier according to claim 1, wherein the first passive element is constituted using any one of components such as a resistor and a variable resistor or using a series circuit composed of plural components.

4. The wideband low-noise amplifier according to claim 1, wherein the second passive element is constituted using any one of components such as a resistor and an inductor or using a series circuit composed of plural components.

5. A wideband low-noise amplifier wherein an input terminal is connected to a base of a first transistor, one terminal of a first passive element, and one terminal of a fifth passive element,
   wherein an emitter of the first transistor is connected directly to ground, and a collector of the first transistor is connected to an output terminal, a base of a second transistor, one terminal of a capacitor, and one terminal of a second passive element,
   wherein an other terminal of the first passive element is connected to an other terminal of the capacitor, an emitter of the second transistor is connected to one terminal of a fourth passive element, and a power terminal is connected to a collector of the second transistor and an other terminal of the second passive element,
   wherein an other terminal of the fourth passive element is connected to an other terminal of the fifth passive element and one terminal of a sixth passive element, and an other terminal of the sixth passive element is grounded,
   wherein impedances of the fourth and sixth passive elements, an impedance of the fifth passive element, or impedances of the fourth, fifth, and sixth passive elements are determined based on an impedance of the first transistor whose emitter size is determined to suit a desired saturation level of amplification, thus establishing input impedance matching.

6. The wideband low-noise amplifier according to claim 5, wherein the fourth passive element is constituted using any one of components such as a resistor, a variable resistor and an inductor or using a series circuit composed of plural components.

7. The wideband low-noise amplifier according to claim 5, wherein the fifth passive element is constituted using any one of components such as a resistor, a variable resistor and an inductor or using a series circuit composed of plural components.

8. The wideband low-noise amplifier according to claim 5, wherein the sixth passive element is constituted using any one of components such as a resistor, a variable resistor and an inductor or using a series circuit composed of plural components.

9. The wideband low-noise amplifier according to claim 5, wherein the first passive element is constituted using any one of components such as a resistor and a variable resistor or using a series circuit composed of plural components.

10. The wideband low-noise amplifier according to claim 5, wherein the second passive element is constituted using any one of components such as a resistor and an inductor or using a series circuit composed of plural components.

11. A wideband low-noise amplifier wherein an input terminal is connected to a base of a first transistor, one terminal of a first passive element, and one terminal of a fifth passive element,
    wherein an emitter of the first transistor is connected directly to ground, and a collector of the first transistor is connected to an output terminal, a base of a second transistor, one terminal of a capacitor, and one terminal of a second passive element,
    wherein an other terminal of the first passive element is connected to other terminal of the capacitor,
    wherein an emitter of the second transistor is connected to an other terminal of the fifth passive element and one terminal of a sixth passive element, and a power terminal is connected to a collector of the second transistor and an other terminal of the second passive element,
    wherein an other terminal of the sixth passive element is grounded, and
    wherein an impedance of the fifth passive element and/or an impedance of the sixth passive element is determined based on an impedance of the first transistor whose emitter size is determined to suit a desired saturation level of amplification.

12. A wideband low-noise amplifier comprising:
    a first transistor whose emitter is connected directly to ground, whose base is connected to an input terminal, and whose collector is connected to an output terminal;
    a negative feedback circuit, one terminal of which is connected to the collector of the first transistor and an other terminal of which is connected to the base of the first transistor;
    a second passive element, one terminal of which is connected to a power terminal and an other terminal of which is connected to the collector of the first transistor; and
    a bias circuit interposed between the power terminal and the base of the first transistor,
    wherein an impedance of the bias circuit is determined based on an impedance of the first transistor whose emitter size is determined to suit a desired saturation level of amplification, thus establishing input impedance matching.

13. The wideband low-noise amplifier according to claim 12 wherein the bias circuit is constituted of a second transistor whose base is connected to the output terminal and whose collector is connected to the power terminal, and a third passive element, one terminal of which is connected to the base of the first transistor and an other terminal of which is connected to an emitter of the second transistor.

14. The wideband low-noise amplifier according to claim 13, wherein the third passive element is constituted of a fourth passive element whose one terminal is connected to an emitter of the second transistor, and a fifth passive element, one terminal of which is connected to an other terminal of the fourth passive element and an other terminal of which is connected to the base of the first transistor.

15. The wideband low-noise amplifier according to claim 14 further comprising a sixth passive element, one terminal of which is connected to the other terminal of the fourth passive element and an other terminal of which is grounded.

16. The wideband low-noise amplifier according to any one of claims 12 to 15, wherein the negative feedback circuit is constituted of a capacitor whose one terminal is connected to the collector of the first transistor, and a first passive element, one terminal of which is connected to the base of the first transistor and an other terminal of which is connected to an other terminal of the capacitor.

* * * * *